(12) United States Patent
Merkin et al.

(10) Patent No.: US 6,751,569 B2
(45) Date of Patent: Jun. 15, 2004

(54) SYSTEM AND METHOD FOR RECEIVING INFORMATION FROM A TEST APPARATUS

(75) Inventors: Cynthia M. Merkin, Georgetown, TX (US); Marc D. Alexander, Cedar Park, TX (US)

(73) Assignee: Dell Products L.P., Round Rock, TX (US)

( * ) Notice: Subject to any disclaimer, the term of this patent is extended or adjusted under 35 U.S.C. 154(b) by 329 days.

(21) Appl. No.: 09/771,051

(22) Filed: Jan. 26, 2001

(65) Prior Publication Data

US 2002/0103611 A1 Aug. 1, 2002

(51) Int. Cl.$^7$ .............................................. G06F 19/00
(52) U.S. Cl. .................. 702/120; 702/119; 714/27; 714/36; 714/799; 717/106; 717/149; 713/1; 713/2
(58) Field of Search ................... 702/120, 119; 714/27, 36, 799, 42, 719; 712/1, 10, 11, 16; 710/100; 717/149, 150, 106; 713/1, 2

(56) References Cited

U.S. PATENT DOCUMENTS

| | | | |
|---|---|---|---|
| 5,388,267 A | 2/1995 | Chan et al. |
| 5,423,029 A | 6/1995 | Schieve |
| 5,535,330 A | 7/1996 | Bell |
| 5,823,818 A | 10/1998 | Bell et al. |
| 5,854,937 A | 12/1998 | Woodward |
| 5,875,293 A | 2/1999 | Bell et al. |

OTHER PUBLICATIONS

Microsoft Press Computer Dictionary, 3$^{rd}$ Edition, 1997, pp. 225–226.*

* cited by examiner

Primary Examiner—John Barlow
Assistant Examiner—Hien Vo
(74) Attorney, Agent, or Firm—Haynes and Boone, LLP

(57) ABSTRACT

A system that includes a computer system configured to boot using a system firmware is provided. The system firmware includes instructions for causing the computer system to provide a control code to a test apparatus configured to perform a functional test on the computer system and receive information provided by the test apparatus in response to the control code.

28 Claims, 8 Drawing Sheets

SYSTEM AND METHOD FOR RECEIVING INFORMATION FROM A TEST APPARATUS

BACKGROUND

The disclosures herein relate generally to computer systems and more particularly to a system and method for receiving information from a test apparatus.

In the process of manufacturing a computer system, certain information may be provided to the computer system. This information may include a serial number or network address, for example. The process of providing information to a computer system typically adds to the amount of time needed to manufacture the computer system.

In addition, a computer system needs to be tested during the manufacturing process to ensure its reliability. Tests performed on a computer system may include functional tests to ensure the function of a computer system and electrical tests to ensure the proper connection of components of the computer system. Like the process of programming information onto a computer system, the process of testing a computer system typically adds to the amount of time needed to manufacture the computer system.

It would be desirable for a test apparatus to be able to communicate with a computer system during the manufacturing process to allow information to be transferred between the test apparatus and the computer system. Therefore, what is needed is a system and method for receiving information from a test apparatus.

SUMMARY

One embodiment, accordingly, provides a system that includes a computer system configured to boot using a system firmware. The system firmware includes instructions for causing the computer system to provide a control code to a test apparatus configured to perform a functional test on the computer system and receive information provided by the test apparatus in response to the control code.

A principal advantage of this embodiment is that it allows a test apparatus to provide information to a computer system during the manufacturing process. As a result, the amount of time needed to manufacture a computer system may be reduced and the manufacturing process may be further automated.

DETAILED DESCRIPTION

Figure 1:
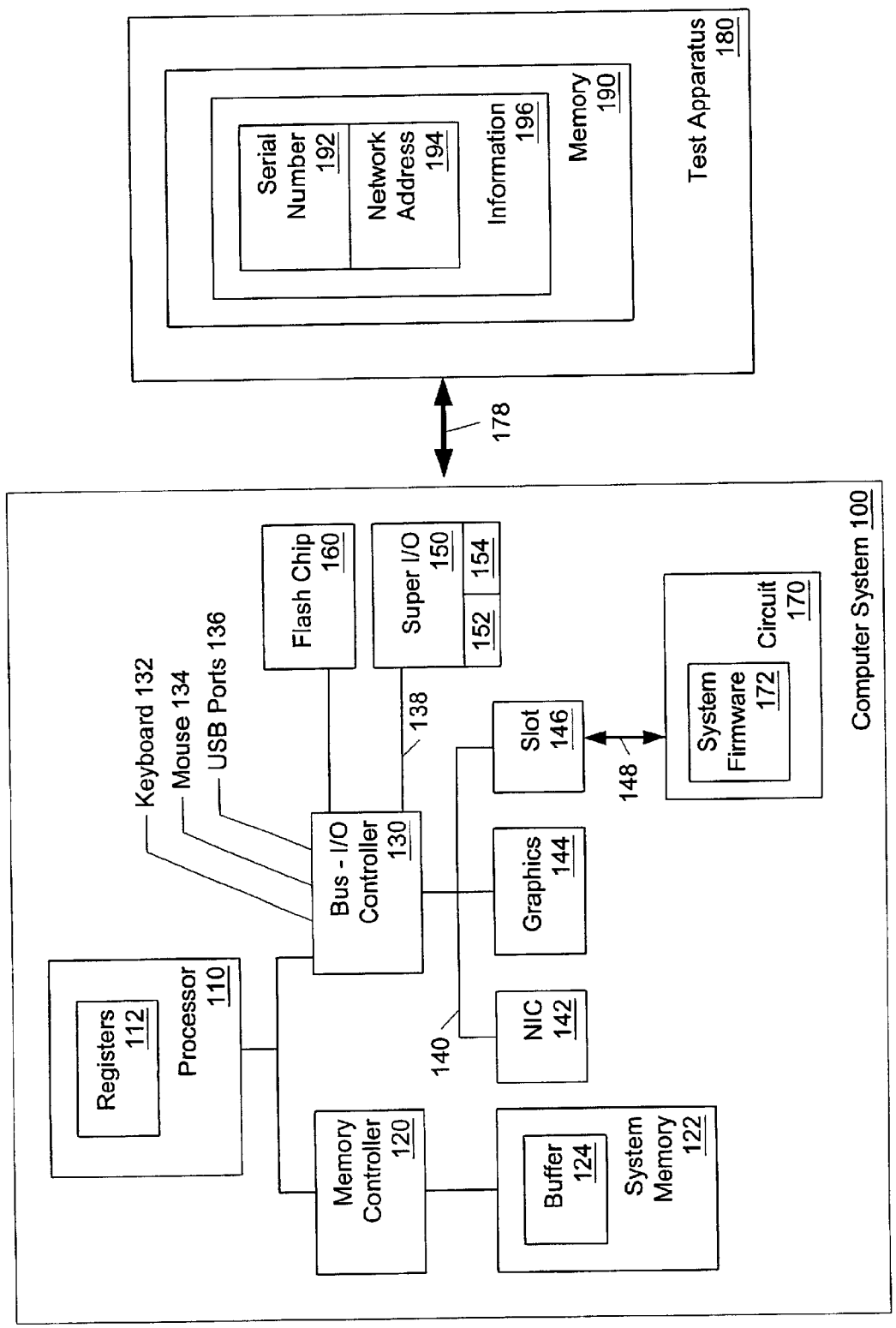
FIG. 1 is a diagram illustrating an embodiment of a computer system and a test apparatus.

FIG. 1 is a diagram illustrating an embodiment of a computer system 100 and a test apparatus 180. Computer system 100 includes a processor 110 that includes one or more registers 112 coupled to a memory controller 120 and a bus—input/output (I/O) controller 130. Memory controller 120 is coupled to a system memory 122 that includes a buffer 124. Bus—I/O controller 130 is coupled to a keyboard 132, a mouse 134, and one or more USB ports 136. Bus—I/O controller 130 is also coupled to a bus 140, such as a PCI bus or other shared bus. Network interface card (NIC) 142, a graphics device 144, and a slot 146 are coupled to bus 140. Bus—I/O controller 130 is further coupled to a super I/O 150 through a bus 138, such as an LPC bus or other type of bus, and a flash chip 160. Super I/O 150 includes a parallel port 152 and a serial port 154. Slot 146 is configured to receive a detachable circuit card 170 as indicated by an arrow 148. Circuit card 170 includes a system firmware 172.

As used herein, the term "computer system" refers to any computing device configured to execute software and is also intended to cover a computer subassembly where one or more components that may comprise the finished computing have not been installed. Accordingly, the term "computer system" may refer to either a partially assembled computing device or a fully assembled computing device in the description herein.

Test apparatus 180 includes a memory 190. Memory 190 stores information 196 including a serial number 192 and a network address 194. Test apparatus 180 is configured to detachably couple to computer system 100 as indicated by an arrow 178. Test apparatus 180 may be a functional verification system (FVS) or other type of test apparatus configured to cause functional tests to be performed on computer system 100. Functional tests verify the functionality of one or more components of computer system 100 including its various computer chips and subsystems. Test apparatus 180 may include the ability to cause the operation of computer system 100 to be simulated at the operational speed of computer system 100 as well as verify the functionality of one or more components of computer system 100. Test apparatus 180 may be a "bed of nails" tester configured to connect to solder points of the motherboard of computer system 100, a plug-in board tester configured to connect to one or more ports of the motherboard, or any other type of tester configured to communicate with computer system 100. In addition, test apparatus 180 may transfer information to and from computer system 100 using any port of computer system 100 such as an ITP port, a JTAG port, a serial port, a parallel port, a USB port, an IR port, or other type of port. In one particular embodiment described in more detail below, test apparatus 180 transfers information to and from computer system 100 using a port configured to access registers 112 on processor 110 such as an ITP port or a JTAG port.

In the manufacturing process of computer system 100, computer system 100 may lack the software needed to boot itself, i.e. it may lack a system firmware. As used herein, the term "system firmware" refers to software configured to boot and/or perform basic setup and initialization functions in a computer system. One example of a system firmware is a basic input output system (BIOS). In one embodiment, circuit 170, which includes system firmware 172, is coupled to slot 146 as indicated by arrow 148 during the manufacturing process and system firmware 172 is used to boot computer system 100. In other embodiments, circuit 170 may be coupled to another port in computer system 100. In the process of booting computer system 100, system firmware 172 causes various components and subsystems of computer system 100, such as system memory 122, to be initialized.

System firmware 172 includes instructions configured to cause computer system 100 to determine whether it is coupled to test apparatus 180. In response to detecting that computer system 100 is coupled to test apparatus 180, instructions in system firmware 172 cause a manufacturing mode of system firmware 172 to be initiated. In response to a manufacturing mode being initiated, system firmware 172 causes certain operations to be performed by computer system 100 and test apparatus 180. These operations include storing system firmware 172 onto a storage device on computer system 100, programming information onto one or more devices in computer system 100, and providing information from computer system 100 to test apparatus 180.

In order to determine whether test apparatus 180 is coupled to computer system 100, system firmware 172 includes instructions that attempt to cause computer system 100 to communicate with test apparatus 180. In one embodiment, computer system 100 and test apparatus 180 communicate by handshaking various predefined values using registers 112 and buffer 124. Test apparatus 180 uses a port that allows direct access to processor 110 and registers 112, such as an ITP port or a JTAG port. In this embodiment, the handshaking is triggered by a predefined trap operation, such as an input/output (I/O) operation or a memory operation, that causes test apparatus 180 to trap. In other embodiments, computer system 100 and test apparatus 180 may communicate by handshaking information using other storage locations such as CMOS locations or I/O locations.

System firmware 172 includes instructions that cause predefined values to be stored in registers 112. System firmware 172 also includes instructions that cause a trap operation to be performed. Test apparatus 180 detects the trap operation, accesses the values in registers 112, and performs a function associated with a control code stored as one of the values in registers 112. The function performed by test apparatus 180 may include storing information from computer system 100 into memory 190 in the test apparatus or storing information into buffer 124 or other locations on computer system 100.

To determine whether test apparatus is coupled to computer system 100, system firmware 172 includes instructions that cause computer system 100 to set buffer 124 to a known value such as by clearing buffer 124, i.e. setting buffer 124 to all zeros. Although buffer 124 is shown as being in system memory 122 in the embodiment of FIG. 1, buffer 124 may be a storage location located in other places such as indexed I/O, e.g. CMOS, in other embodiments. System firmware 172 also includes instructions that cause a buffer identifier and/or address associated with the buffer 124 to be stored in one or more registers 112. The buffer identifier conveys the location, size, and/or other characteristics of buffer 124. System firmware 172 further includes instructions that cause a control code to be stored in one or more of registers 112. System firmware 172 also includes instructions that cause a verification value to be stored in registers 112.

After the control code, buffer identifier, and verification value are stored into registers 112, instructions in system firmware 172 cause a trap operation to be performed. Test apparatus 180 detects the trap operation and accesses the values in registers 112. Test apparatus 180 verifies that the verification value is included in registers 112. If the verification value is not included in registers 112, then test apparatus 180 ignores the control code and resumes its normal functions. If the verification value is not included in registers 112, then test apparatus 180 examines the control code in registers 112. In this case, the control code is a predefined value that causes test apparatus 180, if present, to store another value, i.e. a test string, into the location associated with the buffer identifier, i.e. buffer 124. System firmware 172 includes instructions that cause computer system 100 to determine whether test apparatus 180 stored the test string into buffer 124. If computer system 100 detects the test string in buffer 124, then system firmware 172 determines that test apparatus 180 is coupled to computer system 100 and causes a manufacturing mode of system firmware 172 to be initiated. If computer system 100 does not detect the test string in buffer 124, then system firmware 172 determines that test apparatus 180 is not coupled to computer system 100 and does not cause a manufacturing mode of system firmware 172 to be initiated.

In response to the manufacturing mode being initiated, instructions in system firmware 172 cause various functions to be performed by transferring control codes and other information between computer system 100 and test apparatus 180 using registers 112 and buffer 124. Instructions in system firmware 172 cause functions to be initiated by computer system 100. These instructions cause a control code, a verification value, and/or other information to be stored in registers 112 and a trap operation to be performed as discussed above. In response to a trap operation, verification value, and a control code, test apparatus 180 either performs a function using information provided by computer system 100 or provides information 196 to computer system 100 to allow computer system 100 to perform a function using information 196. Several of these functions performed by computer system 100 and test apparatus 180 will now be described. Other functions are possible and contemplated.

System firmware 172 includes instructions that cause information to be received from test apparatus 180 and stored or programmed onto computer system 100. This information includes a serial number of computer system 100, a network address, such as a 6-byte Ethernet MAC address, of computer system 100, and/or a completion code.

In the case of the serial number, system firmware 172 includes instructions that cause buffer 124 to be cleared, cause a "get serial number" control code, a buffer identifier associated with buffer 124, and a verification value to be stored in registers 112, and cause a trap operation to be performed. In response to detecting the trap operation, test apparatus 180 ensures that the verification value is included in registers 112 and detects the "get serial number" control code and buffer identifier. Test apparatus 180 causes serial number 192 to be stored in the location associated with the buffer identifier, i.e. buffer 124. After serial number 192 is stored into buffer 124, instructions in system firmware 172 cause serial number 192 to be accessed and stored or programmed onto one or more devices on computer system 100. Instructions in system firmware 172 cause status information associated with the storing of serial number 192 to be conveyed to test apparatus 180.

If serial number 192 was successfully stored onto the device, then instructions in system firmware 172 cause a "serial number successful" control code to be stored in registers 112 and cause a trap operation to be performed. Test apparatus 180 detects the "serial number successful" control code and stores information associated with this control code into memory 190.

If serial number 192 was not successfully stored onto the device, then instructions in system firmware 172 cause a "serial number unsuccessful" control code to be stored in registers 112 and cause a trap operation to be performed. Test apparatus 180 detects the "serial number unsuccessful" control code and stores information associated with this control code into memory 190.

In the case of the network address, system firmware 172 includes instructions that cause buffer 124 to be cleared, cause a "get network address" control code, a buffer identifier associated with buffer 124, and a verification value to be stored in registers 112, and cause a trap operation to be performed. Test apparatus 180 responds to the trap operation and "get network address" control code by causing network address 194 to be stored in buffer 124 in a way similar to that just described for serial number 192. After network address 194 is stored into buffer 124, instructions in system firmware 172 cause network address 194 to be accessed and stored or programmed onto one or more devices on computer system 100 such as NIC 142 and system memory 122. Instructions in system firmware 172 cause status information associated with the storing of network address 194 to be conveyed to test apparatus 180.

If network address 194 was successfully stored onto the device, then instructions in system firmware 172 cause a "network address successful" control code to be stored in registers 112 and cause a trap operation to be performed. Test apparatus 180 detects the "network address successful" control code and stores information associated with this control code into memory 190.

If network address 194 was not successfully stored onto the device, then instructions in system firmware 172 cause a "network address unsuccessful" control code to be stored in registers 112 and cause a trap operation to be performed. Test apparatus 180 detects the "network address unsuccessful" control code and stores information associated with this control code into memory 190.

In the case of the completion code, system firmware 172 includes instructions that cause buffer 124 to be cleared, cause a "get completion code" control code, a buffer identifier associated with buffer 124, and a verification value to be stored in registers 112, and cause a trap operation to be performed. Test apparatus 180 responds to the trap operation and "get completion code" control code by causing a completion code (not shown) to be stored in buffer 124 in a way similar to that just described for serial number 192 and network address 194. After the completion code is stored into buffer 124, instructions in system firmware 172 cause the completion code to be accessed and stored or programmed onto one or more devices on computer system 100. The completion code may be used to verify that functional tests were performed and/or successfully completed by test apparatus 180 on computer system 100.

Another function performed during the manufacturing mode of system firmware 172 involves storing or flashing system firmware 172 onto a device such as flash chip 160 on computer system 100. System firmware 172 includes instructions that cause system firmware 172 to be stored onto a device on computer system 100 automatically or in response to certain conditions being met during the manufacturing mode. The storing of system firmware 172 onto the device is done in conjunction with test apparatus 180 to allow test apparatus 180 to attempt to overcome any problems that might arise on from a system firmware hang condition during a verification process associated with the storing.

After computer system 100 boots using system firmware 172, instructions in system firmware 172 cause a store operation to be initiated by storing a "begin flash verification" control code in registers 112 and performing a trap operation. In response to the trap operation, test apparatus 180 starts a watchdog timer to monitor the flash operation. If the watchdog timer expires before computer system 100 indicates that the store operation has completed, then test apparatus 180 stores information indicating the that store operation failed.

In response to the store operation being initiated, instructions in system firmware 172 cause a system firmware previously stored on flash chip 160 to be validated. If the validation process indicates that the previous system firmware is invalid, corrupt, or is not the proper version, then instructions in system firmware 172 cause system firmware 172 to be stored or flashed onto flash chip 160. If the validation process indicates that the previous system firmware is the same version as system firmware 172 and is not corrupt or invalid, then instructions in system firmware 172 do not cause system firmware 172 to be stored or flashed onto flash chip 160.

After system firmware 172 is either stored or not stored onto flash chip 160 according to the validation process, instructions in system firmware 172 cause status information to be conveyed to test apparatus 180 by storing an appropriate control code in registers 112 and performing a trap operation. The control code may indicate that:

1. the store operation is complete with no change to the previous system firmware;
2. the store operation is complete with a version change from the previous system firmware;
3. the store operation is complete with the previous system firmware having an invalid image; or
4. the store operation is complete with a hardware failure in response to the control code. Test apparatus 180 responds to the trap operation and control code by storing information associated with the control code memory 190. If the store operation completes successfully, computer system 100 may be booted subsequently using the system firmware stored on flash chip 160.

After the functions performed during the manufacturing mode of system firmware 172 complete, instructions in system firmware 172 cause a "manufacturing mode complete" control code to be stored in registers 112 and cause a trap operation to be performed. Test apparatus 180 responds to the trap operation and the control code by determining that the manufacturing mode has completed all of the functions in the manufacturing mode process.

In one particular embodiment where processor 110 is an x86 processor such as the Pentium III processor, the EBX, ECX, EDX, EDI, and ESI registers may be used to handshake information between computer system 100 and test apparatus 180. Specifically, control codes may be stored in the EBX register, verification codes may be stored in the ECX register, and buffer identifiers may be stored in the EDX and EDI registers. In addition, the ESI register may be set to all zeros.

Although the above embodiment described computer system 100 and test apparatus 180 communicating by handshaking information using registers 112 and buffer 124, computer system 100 and test apparatus 180 may communicate in other ways in other embodiments.

Figure 2:
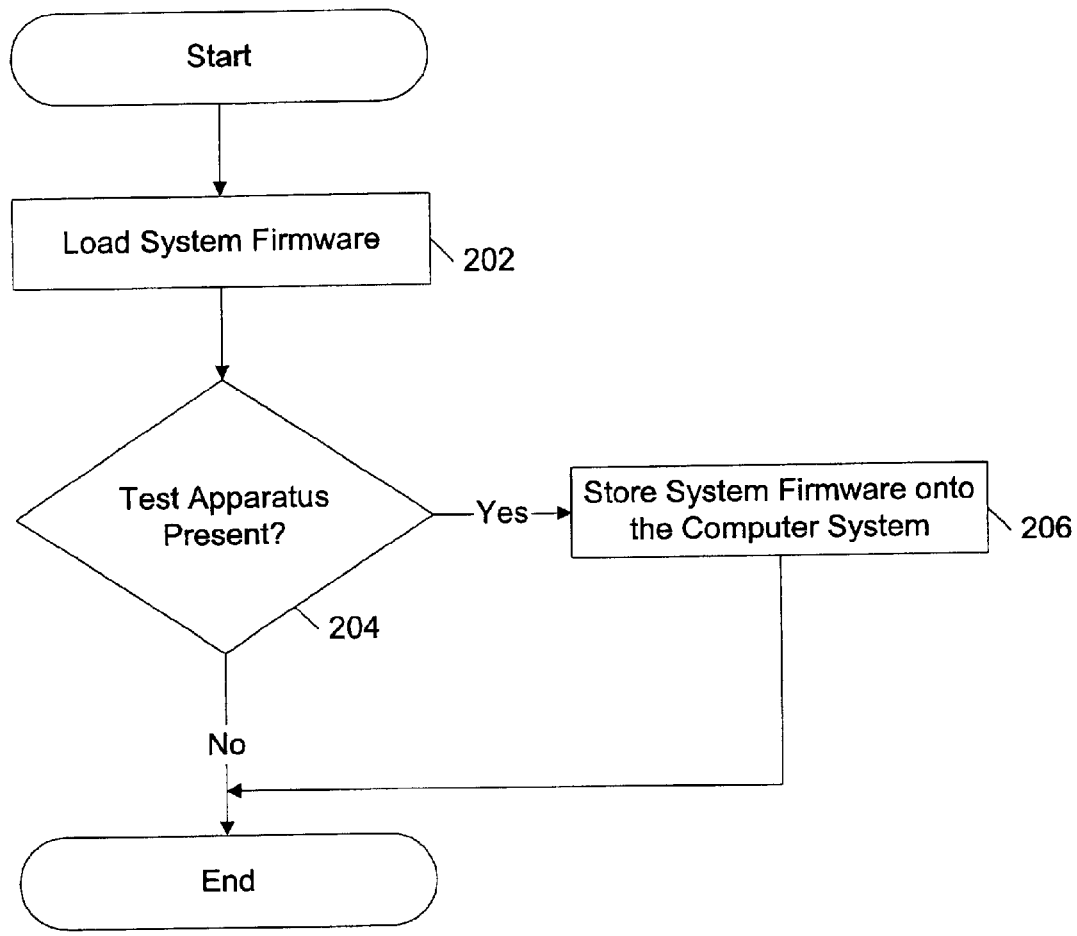
FIG. 2 is a flowchart illustrating an embodiment of a method for installing a system firmware onto a computer system.

FIG. 2 is a flowchart illustrating an embodiment of a method for installing a system firmware onto a computer system. In FIG. 2, a system firmware is loaded onto a computer system as indicated in step 202. The system firmware may be loaded from a circuit coupled to the computer system as discussed above. A determination is made as to whether a test apparatus is present as indicated in step 204. A test apparatus may be detected in the manner described above or in other suitable ways. If a test apparatus is present, then the system firmware is stored onto the computer system as indicated in step 206. If a test apparatus is not present, then the system firmware is not flashed onto the computer system.

Figure 3:
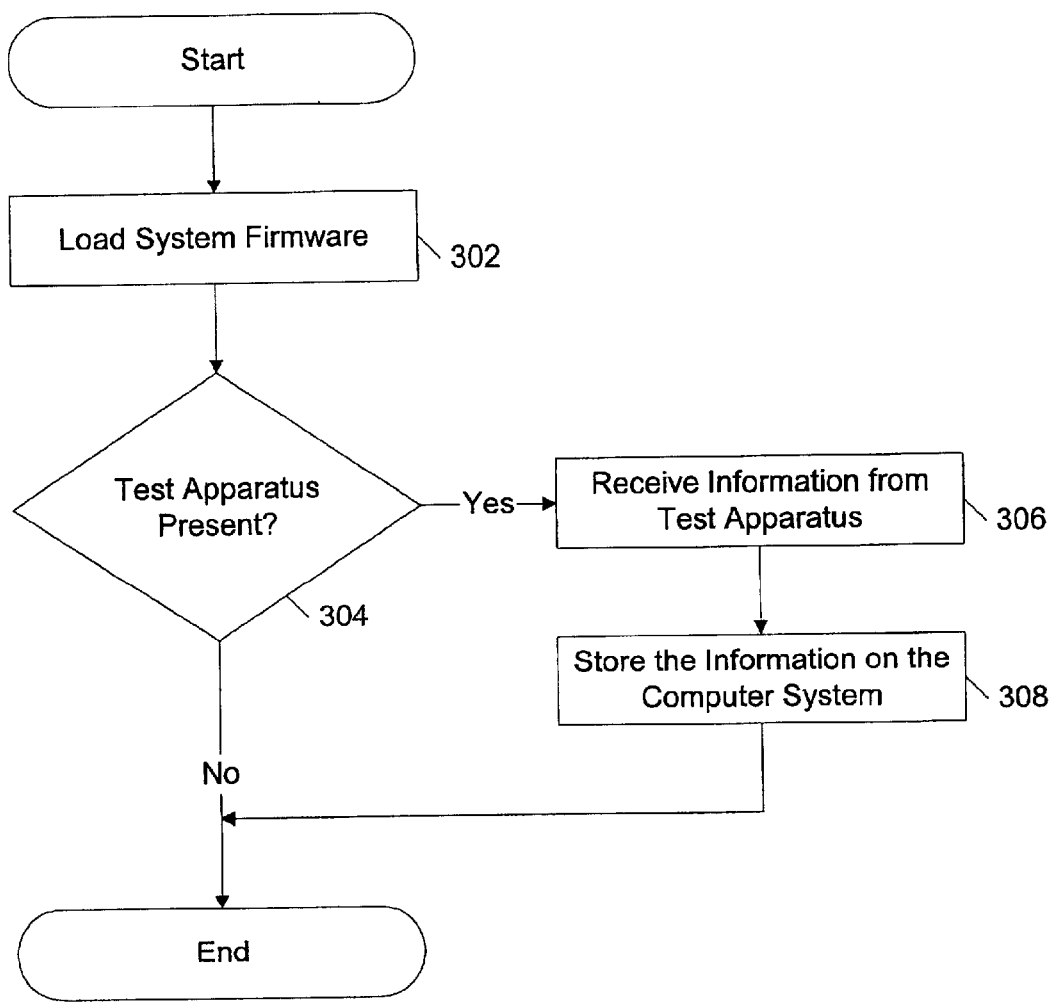
FIG. 3 is a flowchart illustrating an embodiment of a method for providing information to a computer system.

FIG. 3 is a flowchart illustrating an embodiment of a method for providing information to a computer system. In FIG. 3, a system firmware is loaded onto a computer system as indicated in step 302. The system firmware may be loaded from a circuit coupled to the computer system as discussed above. A determination is made as to whether a test apparatus is present as indicated in step 304. A test apparatus may be detected in the manner described above or in other suitable ways. If a test apparatus is present, then information is received from the test apparatus as indicated in step 306, and a function is performed on the computer system using the information as indicated in step 308. The information may be a network address or other information. The function may include programming the information onto a device in the computer system. If a test apparatus is not present, then information is not received from the test apparatus.

Figure 4:
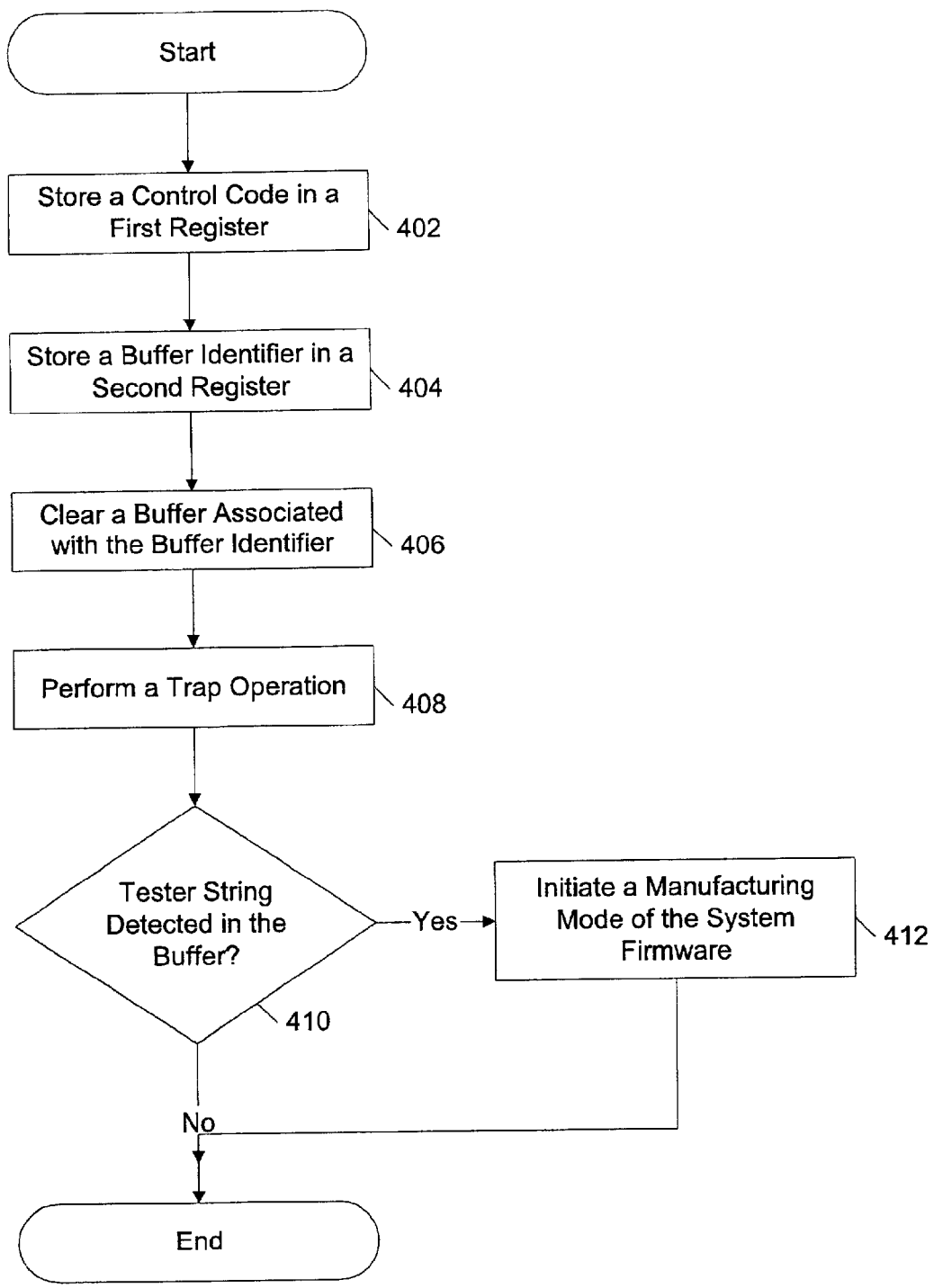
FIG. 4 is a flowchart illustrating an embodiment of a method for initiating a manufacturing mode of a system firmware.

FIG. 4 is a flowchart illustrating an embodiment of a method for initiating a manufacturing mode of a system firmware. In FIG. 4, a control code is stored in a first register as indicated in step 402. A buffer identifier is stored in a second register as indicated in step 404. A buffer associated with the buffer identifier is cleared as indicated in step 406. A trap operation is performed as indicated in step 408. A determination is made as to whether a test string is detected in the buffer as indicated in step 410. If a test string is detected in the buffer, then a manufacturing mode of the system firmware is initiated as indicated in step 412. If a test string is not detected in the buffer, then a manufacturing mode of the system firmware is not initiated.

Figure 5:
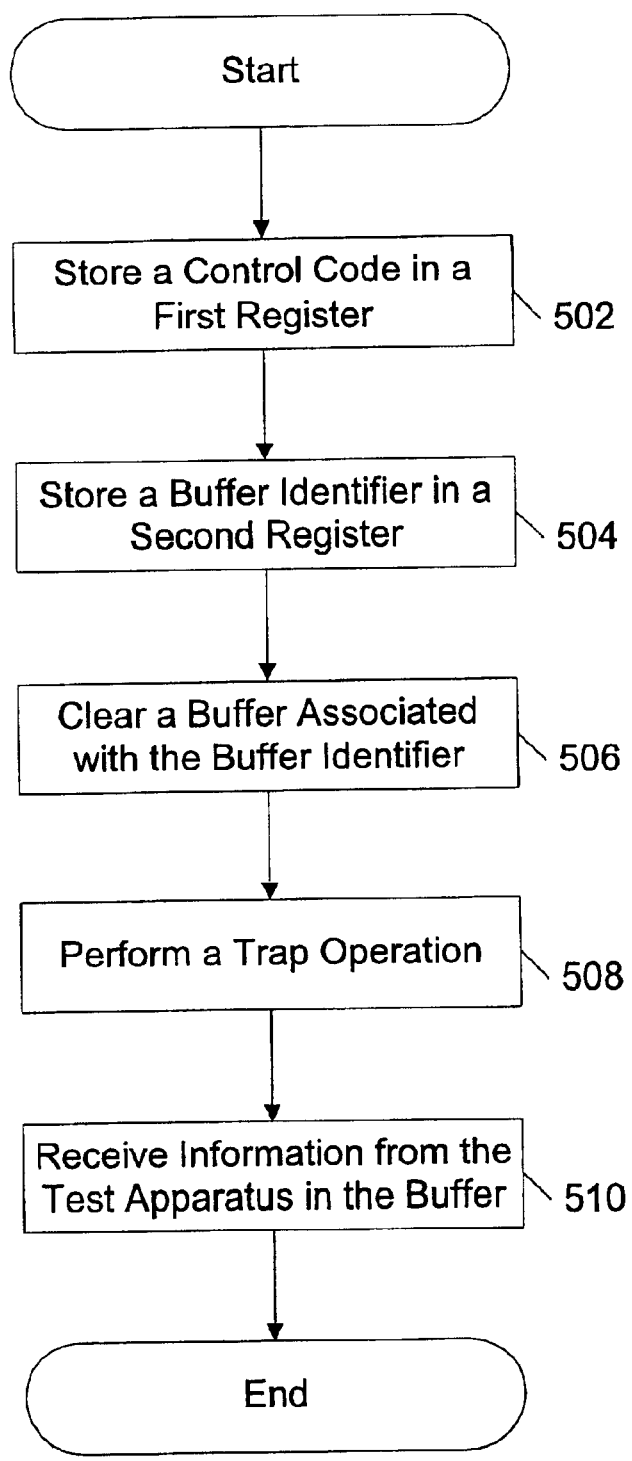
FIG. 5 is a flowchart illustrating an embodiment of a method for transferring information from a test apparatus to a computer system.

FIG. 5 is a flowchart illustrating an embodiment of a method for transferring information from a test apparatus to a computer system. In FIG. 5, a control code is stored in a first register as indicated in step 502. A buffer identifier is stored in a second register as indicated in step 504. A buffer associated with the buffer identifier is cleared as indicated in step 506. A trap operation is performed as indicated in step 508. Information from the test apparatus is received in the buffer as indicated in step 510.

Figure 6:
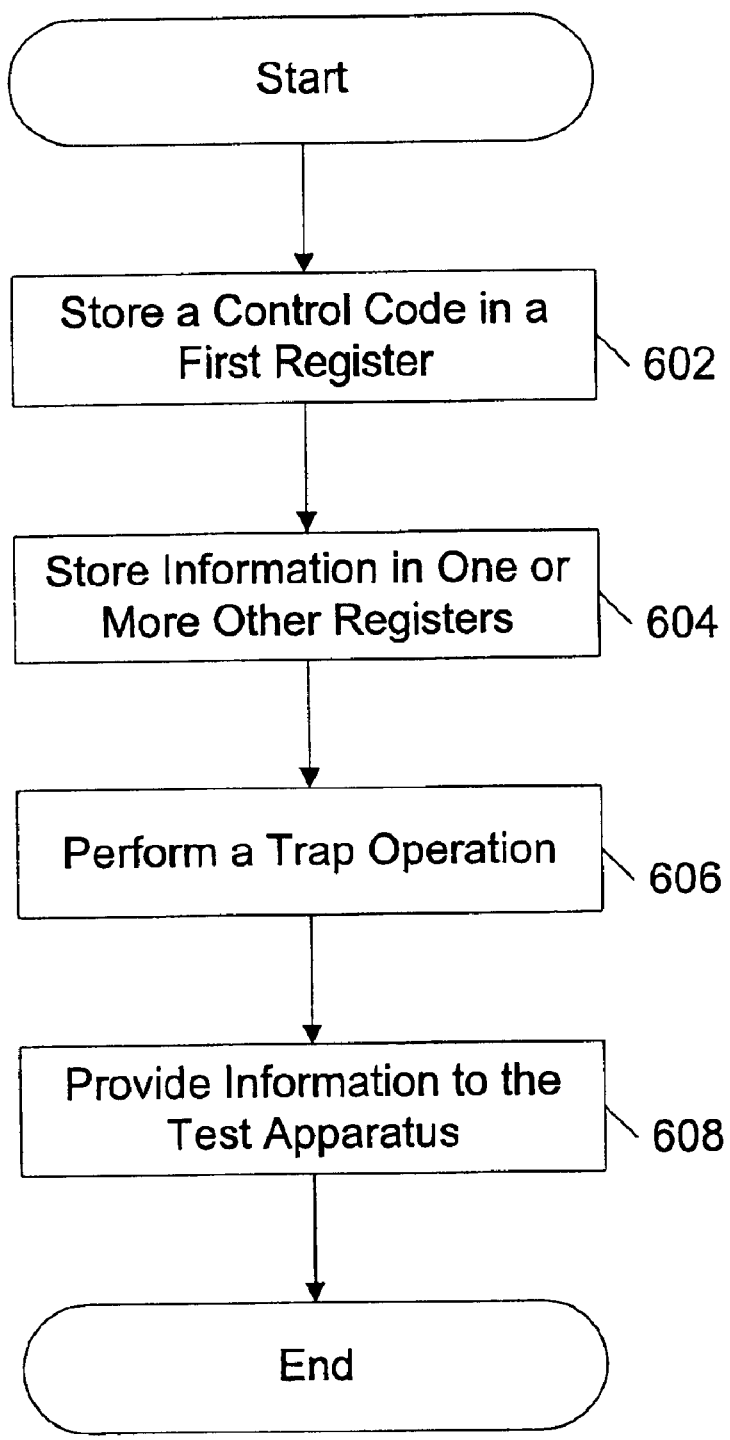
FIG. 6 is a flowchart illustrating an embodiment of a method for transferring information from a computer system to a test apparatus.

FIG. 6 is a flowchart illustrating an embodiment of a method for transferring information from a computer system to a test apparatus. In FIG. 6, a control code is stored in a first register as indicated in step 602. Information is stored in one or more other registers as indicated in step 604. A trap operation is performed as indicated in step 606. Information is provided to the test apparatus as indicated in step 608.

Figure 7A:
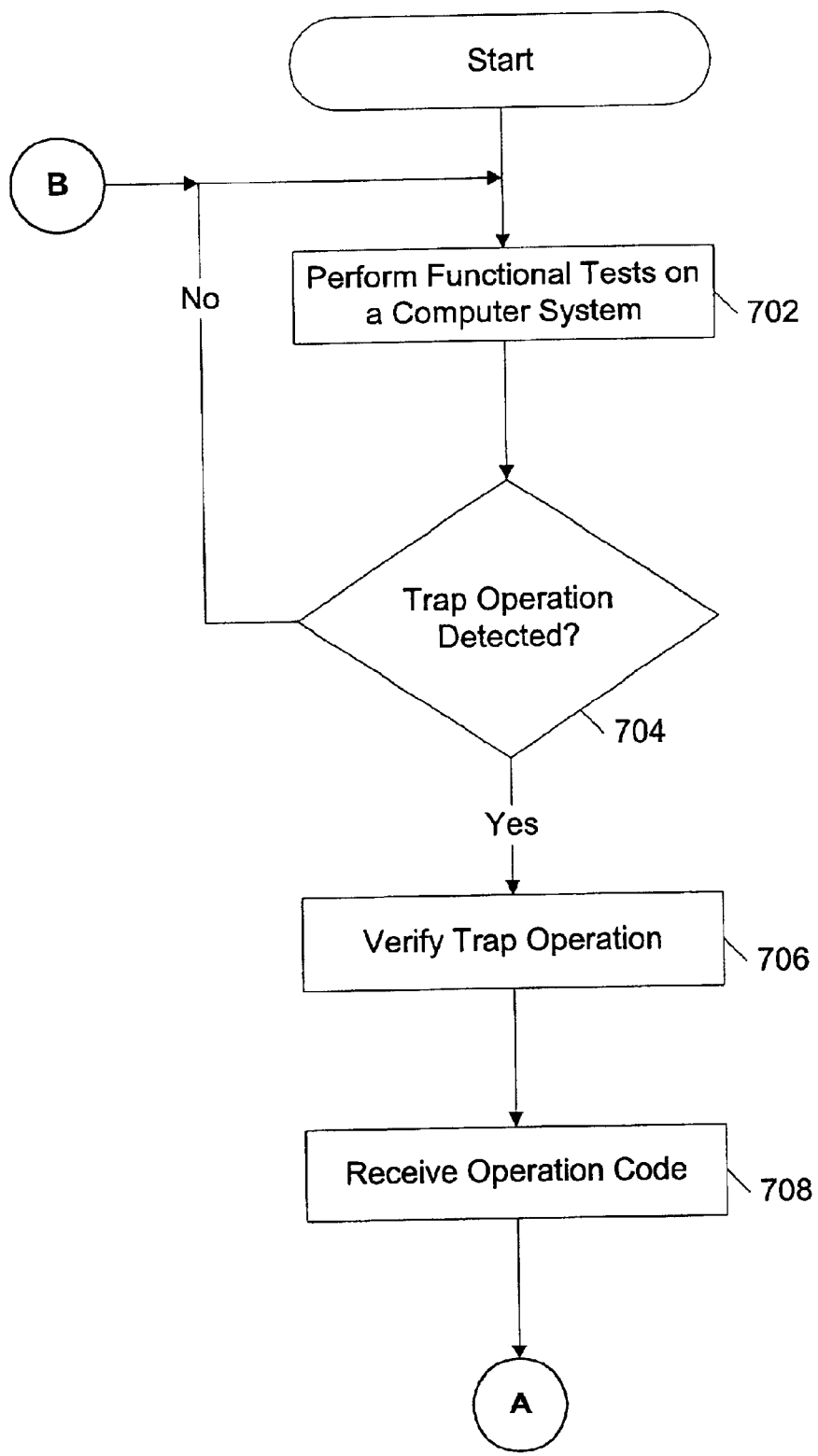
FIG. 7a is a first portion of a flowchart illustrating an embodiment of a method for performing functional tests on a computer system and for transferring information between a test apparatus and a computer system.
Figure 7B:
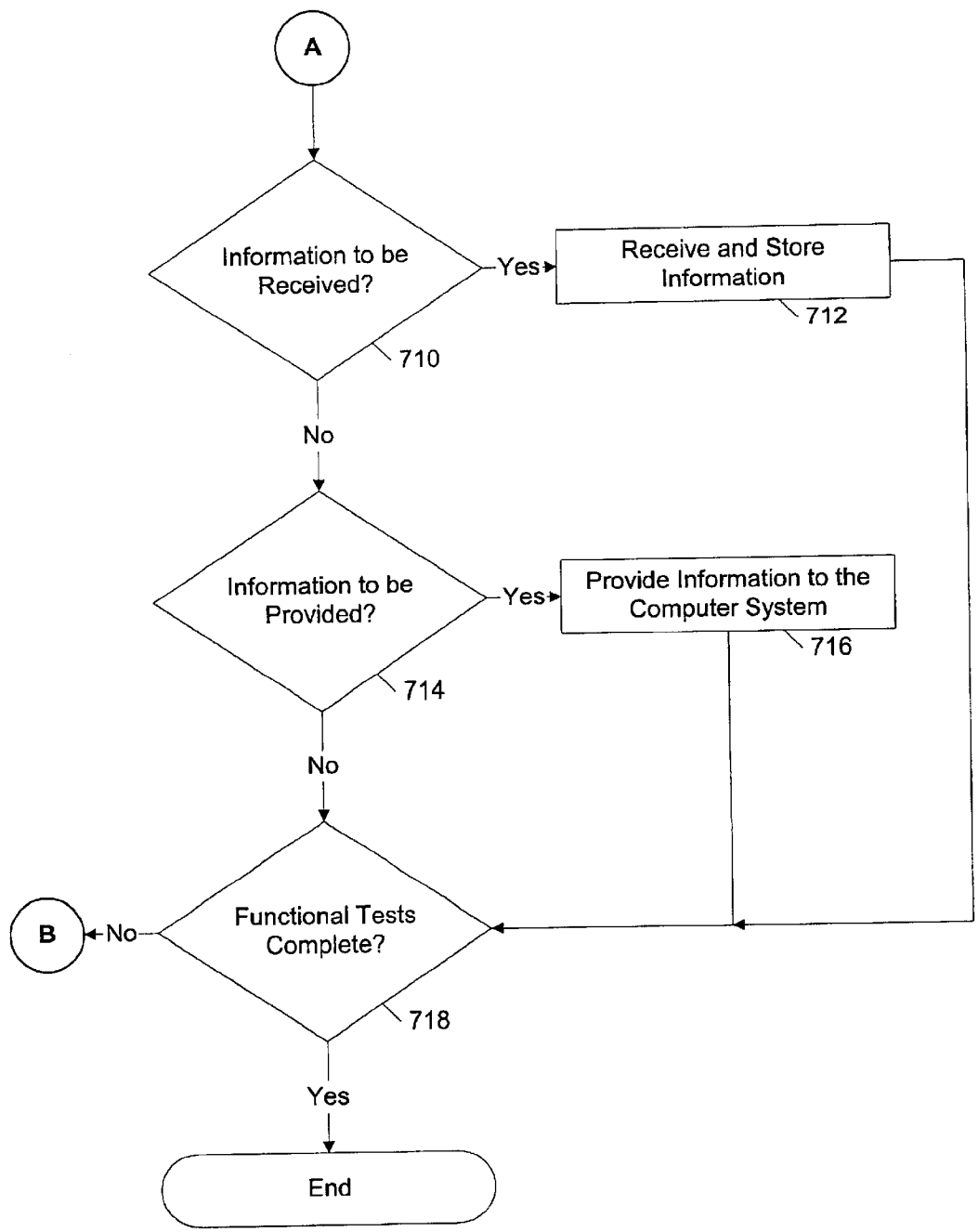
FIG. 7b is a second portion of a flowchart illustrating an embodiment of a method for performing functional tests on a computer system and for transferring information between a test apparatus and a computer system.

FIGS. 7a and 7b are a first portion and a second portion of a flowchart illustrating an embodiment of a method for performing functional tests on a computer system and for transferring information between a test apparatus and a computer system. In FIG. 7a, functional tests are performed on a computer system by a test apparatus as indicated in step 702. A determination is made by the test apparatus as to whether a trap operation is detected as indicated in step 704. If a trap operation is not detected, then step 702 is repeated. If a trap operation is detected, then the trap operation is verified as indicated in step 706. A control code is received as indicated in step 708.

The flowchart continues at point A on FIG. 7b. A determination is made as to whether information is to be received from the computer system as indicated in step 710. If information is to be received from the computer system, then the information is received and stored by the test apparatus as indicated in step 712. A determination is made as to whether the functional tests are complete as indicated in step 718. If the functional tests are not complete, then step 702 is repeated, i.e. the flowchart continues at point B on FIG. 7a. If the functional tests are complete, then step 702 is not repeated.

If information is not to be received from the computer system as determined in step 710, then a determination is made as to whether information is to be provided by the test apparatus to the computer system as indicated in step 714. If information is to be provided by the test apparatus to the computer system, then the information is provided by the test apparatus to the computer system as indicated in step 716. A determination is made as to whether the functional tests are complete as indicated in step 718. If the functional tests are not complete, then step 702 is repeated, i.e. the flowchart continues at point B on FIG. 7a. If the functional tests are complete, then step 702 is not repeated.

If information is not to be provided by the test apparatus to the computer system, then a determination is made as to whether the functional tests are complete as indicated in step 718. If the functional tests are not complete, then step 702 is repeated, i.e. the flowchart continues at point B on FIG. 7a. If the functional tests are complete, then step 702 is not repeated.

As can be seen, the principal advantages of these embodiments are that they allow a test apparatus to provide information to a computer system during the manufacturing process. As a result, the amount of time needed to manufacture a computer system may be reduced and the manufacturing process may be further automated.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A system comprising:
   a computer system including a processor and a memory and configured to boot using a system firmware;
   the system firmware including instructions for causing the computer system to:
   communicate by handshaking information using registers and a buffer, the handshaking being triggered by a trap operation;
   provide a control code to a test apparatus configured to perform a functional test on the computer system; and
   receive information provided by the test apparatus in response to the control code, the test apparatus using a port having direct access to the processor and the registers.

2. The system of claim 1, wherein the system firmware includes instructions for causing the computer system to:
   perform an input/output operation to cause the test apparatus to access the control code.

3. The system of claim 1, wherein the system firmware includes instructions for causing the computer system to:
   perform a memory operation to cause the test apparatus to access the control code.

4. The system of claim 1, wherein the system firmware includes instructions for causing the computer system to:
   store the information provided by the test apparatus onto the computer system.

5. The system of claim 4, wherein the information includes a network address.

6. The system of claim 4, wherein the information includes a serial number.

7. The system of claim 1, wherein the system firmware includes instructions for causing the computer system to:
   provide an address of a storage location to the test apparatus; and
   access the information provided by the test apparatus from the storage location identified by the address.

8. A computer program product comprising:
   a system firmware processable by a computer system for causing the computer system to:
   communicate by handshaking information using registers and a buffer, the handshaking being triggered by a trap operation;

provide a control code to a test apparatus configured to perform a functional test on the computer system; and receive information provided by the test apparatus in response to the control code, the test apparatus using a port having direct access to the registers; and a storage apparatus from which the system firmware is accessible by the computer system.

9. The computer program product of claim 8, the system firmware processable by the computer system for causing the computer system to:

perform an input/output operation to cause the test apparatus to access the control code.

10. The computer program product of claim 8, the system firmware processable by the computer system for causing the computer system to:

perform a memory operation to cause the test apparatus to access the control code.

11. The computer program product of claim 8, the system firmware processable by the computer system for causing the computer system to:

store the information provided by the test apparatus onto the computer system.

12. The computer program product of claim 11, wherein the information includes a network address.

13. The computer program product of claim 11, wherein the information includes a serial number.

14. The computer program product of claim 8, the system firmware processable by the computer system for causing the computer system to:

provide an address of a storage location to the test apparatus; and access the information provided by the test apparatus from the storage location identified by the address.

15. A system comprising:

a computer system configured to boot using a system firmware;

the system firmware including instructions for causing the computer system to:

communicate by handshaking information using registers and a buffer, a buffer identifier being stored in one or more of the registers;

provide a control code to a test apparatus configured to perform a functional test on the computer system, the test apparatus using a port having direct access to the registers; and provide first information associated with the control code to the test apparatus.

16. The system of claim 15, wherein the system firmware includes instructions for causing the computer system to:

perform an input/output operation to cause the test apparatus to access the control code and the first information.

17. The system of claim 15, wherein the system firmware includes instructions for causing the computer system to:

perform a memory operation to cause the test apparatus to access the control code and the first information.

18. The system of claim 15, wherein the control code identifies an operation performed by the system firmware on the computer system, and wherein the first information comprises status information associated with the operation.

19. The system of claim 18, wherein the operation comprises storing the system firmware onto a device in the computer system.

20. The system of claim 18, wherein the operation comprises storing second information provided by the test apparatus onto the computer system.

21. The system of claim 18, wherein the operation comprises terminating a manufacturing mode of the system firmware.

22. A computer program product comprising:

a system firmware processable by a computer system for causing the computer system to:

communicate by handshaking information using registers and a buffer, a buffer identifier being stored in one or more of the registers the handshaking being triggered by a trap operation; provide a control code to a test apparatus configured to perform a functional test on the computer system; and provide first information associated with the control code to the test apparatus; and a storage apparatus from which the system firmware is accessible by the computer system.

23. The computer program product of claim 22, the system firmware processable by the computer system for causing the computer system to:

perform an input/output operation to cause the test apparatus to access the control code and the first information.

24. The computer program product of claim 22, the system firmware processable by the computer system for causing the computer system to:

perform a memory operation to cause the test apparatus to access the control code and the first information.

25. The computer program product of claim 22, wherein the control code identifies an operation performed by the system firmware on the computer system, and wherein the first information comprises status information associated with the operation.

26. The computer program product of claim 25, wherein the operation comprises storing the system firmware onto a device in the computer system.

27. The computer program product of claim 25, wherein the operation comprises storing second information provided by the test apparatus onto the computer system.

28. The computer program product of claim 25, wherein the operation comprises terminating a manufacturing mode of the system firmware.

* * * * *